(12) United States Patent
Zhang et al.

(10) Patent No.: US 6,661,024 B1
(45) Date of Patent: Dec. 9, 2003

(54) INTEGRATED CIRCUIT INCLUDING FIELD EFFECT TRANSISTOR AND METHOD OF MANUFACTURE

(75) Inventors: Jie Zhang, Buffalo Grove, IL (US); Paul Brazis, South Elgin, IL (US); Daniel Gamota, Palatine, IL (US); Krishna Kalyanasundaram, Chicago, IL (US); Steven Scheifers, Hoffman Estates, IL (US); Jerzy Wielgus, Park Ridge, IL (US); Abhijit Roy Chowdhuri, Oak Park, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/187,737

(22) Filed: Jul. 2, 2002

(51) Int. Cl.[7] .......................... H01L 35/24; H01L 51/40
(52) U.S. Cl. ........................ 257/40; 257/347; 438/99
(58) Field of Search .................... 257/40, 347, 764, 257/766; 438/99, 149, 158

(56) References Cited

U.S. PATENT DOCUMENTS 5,796,121 A * 8/1998 Gates .......................... 257/59
6,518,949 B2 * 2/2003 Drzaic .......................... 257/40

* cited by examiner

Primary Examiner—Mark V. Prenty
(74) Attorney, Agent, or Firm—Daniel K. Nichols

(57) ABSTRACT

An integrated circuit (100, 200, 300, 400) that includes a field effect transistor (102, 202, 302, 402) is fabricated by forming an organic semiconductor channel (112, 216, 308, 418) on one substrate (106, 204), forming device electrodes (114, 116, 110, 208, 210, 212) on one or more other substrates (104, 108, 206), and subsequently laminating the substrates together. In one embodiment, a dielectric patch (214) that functions as a gate dielectric is formed on one of the substrates (204, 206) prior to performing the lamination. Lamination provides a low cost route to device assembly, allows for separate fabrication of different device structures on different substrates, and thins various device layers resulting in improved performance.

15 Claims, 5 Drawing Sheets

INTEGRATED CIRCUIT INCLUDING FIELD EFFECT TRANSISTOR AND METHOD OF MANUFACTURE

CROSS REFERENCE TO RELATED APPLICATION

This application is related to U.S. application Ser. No. 10/187,516, by Jie Zhang, Paul Brazis, Daniel Gamota, and Steven Scheifers, entitled "ORGANIC CONTACT-ENHANCING LAYER FOR ORGANIC FIELD EFFECT TRANSISTORS," filed concurrently herewith, and assigned to Motorola, Inc.

This invention was made with United States Government support under Agreement No. 70NANB0H3033 awarded by the National Institute of Standards and Technology (NIST). The United States Government has certain rights in the invention.

FIELD OF THE INVENTION

The invention relates to microelectronics fabrication methods and devices produced by such methods.

BACKGROUND OF THE INVENTION

Traditionally microelectronics have been fabricated out of inorganic materials. Although microelectronics fabricated utilizing single crystal wafers have been dominant, for special applications such as active displays in which large-area microelectronic circuits are required, polycrystalline or amorphous materials deposited on an insulating organic or inorganic substrate have been used. The fabrication of microelectronics using either crystalline or amorphous inorganic materials entails a long sequence of costly processing operations, and is generally rather complex and expensive.

Recently there has been an increased interest in exploring the commercial use of organic semiconductors as a substitute for inorganic semiconductors.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENTS

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Figure 1:
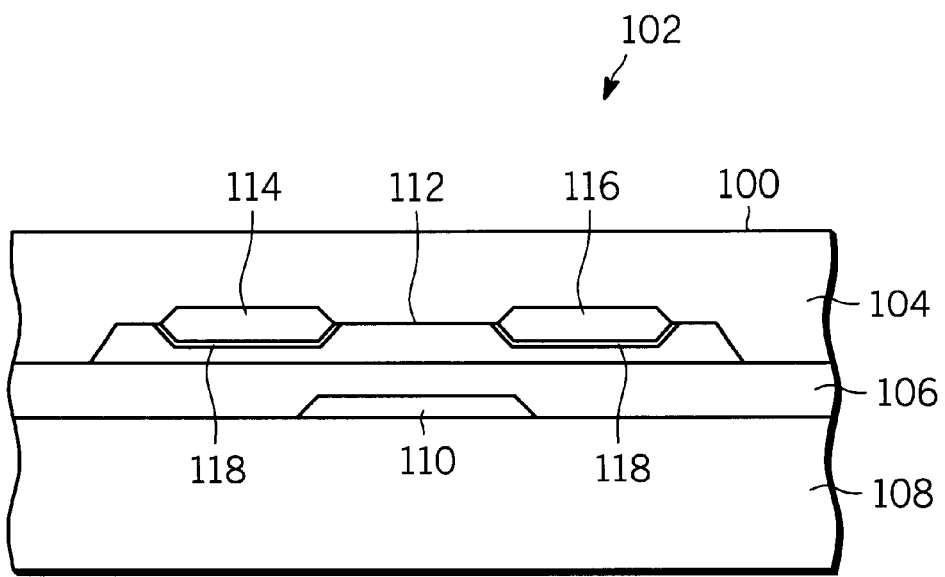
FIG. 1 is a broken out sectional elevation view of a portion of an integrated circuit that includes a field effect transistor according to the preferred embodiment of the invention.

FIG. 1 is a broken out sectional elevation view of a portion of a first integrated circuit 100 that includes a first field effect transistor 102 according to the preferred embodiment of the invention. The integrated circuit 100 comprises a first substrate 104, a second substrate 106, and a third substrate 108 that are laminated together. The second substrate 106 is located between the first substrate 104 and the third substrate 108. A gate electrode 110 that is initially formed on the third substrate 108 is located between the second substrate 106 and the third substrate 108. An organic semiconductor channel 112 that is initially formed on the second substrate 106 is located between the first substrate 104, and the second substrate 106. A source electrode 114 and a drain electrode 116 that are initially formed on the first substrate 100 are arranged spaced apart between the first substrate 104 and the organic semiconductor channel 112. A contact enhancing layer 118 is preferably present at the interface of the source 114 and drain 116 electrodes and the organic semiconductor channel 112. A first class of materials that are suitable for use as the contact enhancing layer 118 are metal based. Metals that are used as the contact enhancing layer 118 are preferably selected from the group consisting of chromium, non-ferrous alloys of chromium, zinc, alloys of zinc, titanium, alloys of titanium, tin, and tin alloys. Alternatively, the contact enhancing layer 118 comprises a molecular liquid agent. Octadecyltrichlorosilane is a molecular liquid agent that is especially suited for use as the contact enhancing layer 118 in combination with an organic semiconductor channel 112 that comprises a polythiophene family compound. Additional contacting enhancing materials, useful in the present invention as for layer 118, are disclosed in a related patent application, referenced above as docket number CML00394T, filed concurrently herewith, which is hereby incorporated by reference as if fully set out herein.

The second substrate 106 functions as a gate dielectric layer. In addition, the second substrate 106 can provide the molecular structural means to preferentially orient the organic semiconductor that comprises device structures (e.g., channel 112) thereby enhancing electrical performance. An oriented polymer based film is especially suitable for use as second substrate 106 or as other substrates disclosed herein below that support organic semiconductor device structures. The molecular level surface structure of an oriented polymer based film, tends to preferentially orient organic semiconductor device structures (e.g., channel 112) supported thereon, leading to an increased ordering within the organic semiconductor and improved electrical performance.

Alternatively, relative to what is shown in FIG. 1, the second substrate 106 is eliminated and a separate gate dielectric is formed on the gate 110, and the organic semiconductor channel 112 is subsequently formed over the separate gate dielectric. Further, in respect to this alternative, it bears mentioning that the organic semiconductor channel 112 can be initially formed on the first substrate 104 or the third substrate 108.

Other circuit components, primarily resistors and capacitors, that can be used in integrated circuits can be formed in a variety of ways. For example, a capacitor can be formed by locating a first electrode between the first substrate 104 and the second substrate 106, and locating a second electrode directly across the second substrate 106 opposite the first electrode, between the second substrate 106 and the third substrate 108. A resistor is alternatively be formed between the first 104 and second 108 substrates by forming two terminal electrodes in contact with and at opposite ends of an elongated portion of organic semiconductor material. Such a resistor resembles the field effect transistor 102, however it does not include a gate electrode. The resistive materials for the resistors can be, but are not limited to, any resistive polymer thick film pastes, resistive polymers, etc.

Figure 2:
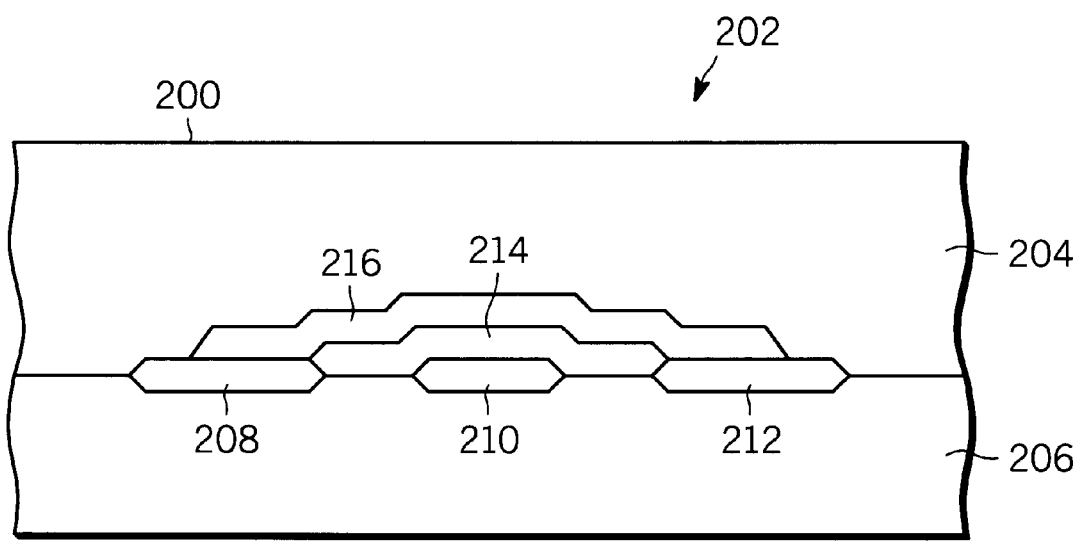
FIG. 2 is a broken out sectional elevation view of a portion of an integrated circuit that includes a field effect transistor according to a first alternative embodiment of the invention.

FIG. 2 is a broken out sectional elevation view of a portion of a second integrated circuit 200 that includes a second field effect transistor 202 according to a first alternative embodiment of the invention. The second integrated circuit 200 comprises a first substrate 204 and a second substrate 206. A source electrode 208, a gate electrode 210, and a drain electrode 212 are located on the second substrate 206 between the first substrate 204, and the second substrate 206. A gate dielectric patch 214 covers the gate electrode 210. An organic semiconductor channel 216 extends from the source electrode 208 over the gate dielectric patch 214 to the drain electrode 212. The source electrode 208 and the drain electrode 210 contact and partially overlap the organic semiconductor channel 216. The dielectric patch 214 and the organic semiconductor channel 216 are located between the first substrate 204 and the second substrate 206. The organic semiconductor channel 216 is located proximate the first substrate 204. The arrangement of the above described device components is alternatively be varied. For example either or both of the source electrode 208 and the drain electrode 212 can be placed between the organic semiconductor channel 216 and the first substrate 204, rather than being located between the organic semiconductor channel 216 and the second substrate 206 as shown in FIG. 2. Alternatively, the gate electrode 210 is alternatively placed on the exterior surface of either the first 204 or second 206 substrates, rather than being located between the two substrates 204, 206 as shown. In the latter case, one of the substrates 204, 206 would serve a gate dielectric role, and the dielectric patch 214 would be eliminated.

Figure 3:
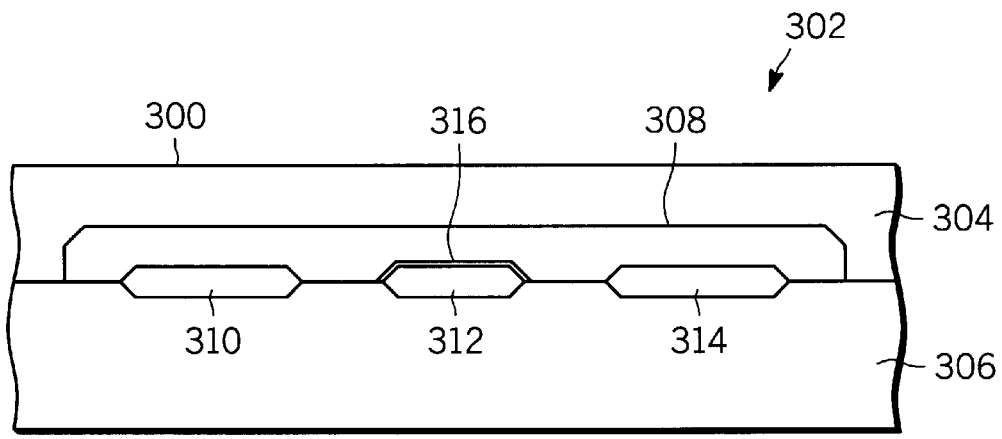
FIG. 3 is a broken out sectional elevation view of a portion of an integrated circuit that includes a field effect transistor according to a second alternative embodiment of the invention.

FIG. 3 is a broken out sectional elevation view of a portion of a third integrated circuit 300 that includes a third field effect transistor 302 according to a second alternative embodiment of the invention. The third field effect transistor 302 comprises a first substrate 304 and a second substrate 306. An organic semiconductor channel 308 that is preferably initially formed on the first substrate 304 is disposed between the first substrate 304 and the second substrate 306. A source electrode 310, a gate electrode 312, and a drain electrode 314 are disposed between the organic semiconductor channel 308 and the second substrate 306. Alternatively, one or more of the source electrode 310, gate electrode 312 and drain electrode 314 are disposed between the organic semiconductor channel 308 and the first substrate 304. The material of the gate electrode is chosen in consideration of the material of the organic semiconductor channel 308 so that a Schottky junction 316 is formed between the gate electrode 312 and the organic semiconductor channel 308. In order to form the Schottky junction 316, it is preferable to use a gate electrode material that is characterized by a work function that is sufficient with respect to the physical properties of the organic semiconductor channel 308 to create the Schottky junction 316 between the gate electrode 312 and organic semiconductor channel 308. Providing the Schottky junction 316 eliminates the need for a dielectric material such as employed in the first alternative embodiment shown in FIG. 2. Although the gate electrode 312 need not be a metal, metals that are alternatively used to form Schottky contacts to the organic semiconductor channel 308 include aluminum, magnesium, titanium, tantalum, manganese, and zinc. The materials of the source and drain electrodes 310, 314 are preferably chosen in consideration of the properties of the material of the organic semiconductor channel 308 so as to form an ohmic contact to the organic semiconductor channel 308. Although the source and drain electrodes 310, 314 need not be metal, metals that are alternatively used to form ohmic contacts to the organic semiconductor channel 308 include copper, gold, silver, nickel, platinum, and tungsten.

Figure 4:
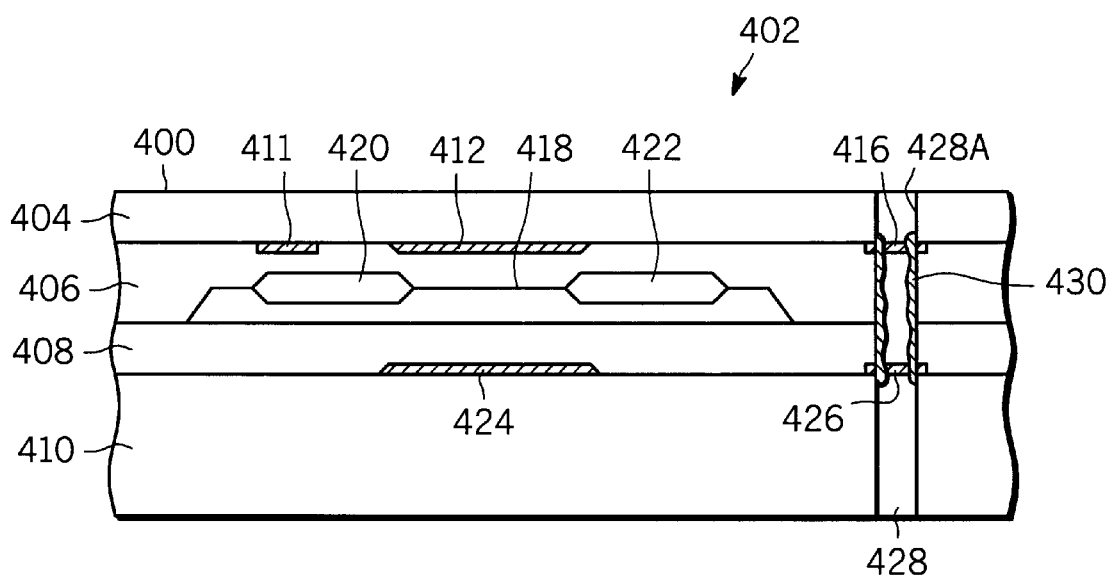
FIG. 4 is a broken out sectional elevation view of a portion of an integrated circuit that includes a dual gate field effect transistor according to a third alternative embodiment of the invention.

FIG. 4 is a broken out sectional elevation view of a portion of an integrated circuit 400 that includes a dual gate field effect transistor 402 according to a third alternative embodiment of the invention. The integrated circuit 400 includes a first substrate 404, a second substrate 406, a third substrate 408, and a fourth substrate 410. A first gate electrode 412 is located between the first substrate 404 and the second substrate 406. A first segment of a conductive trace 414, and a second segment of a conductive trace 416 are also located between the first substrate 404 and the second substrate 406. The aforementioned conductive trace segments 414, 416 are preferably formed in a process that is also used to form the first gate 412. One or both of the conductive trace segments 414, 416 is preferably used to interconnect the dual gate field effect transistor 402 with other circuit components (e.g., other field effect transistors) of the integrated circuit 400.

An organic semiconductor channel 418 is located between the second substrate 406 and the third substrate 408. A source electrode 420 and a drain electrode 422 are located on opposite sides (laterally) of the first gate electrode 412, between the second substrate 406 and the organic semiconductor channel 418. The second substrate isolates the first gate electrode 412 from the organic semiconductor channel 418. A second gate electrode 424 is located laterally aligned with the first gate electrode 412 between the third substrate 408, and the fourth substrate 410. Providing two gates rather than only a single gate increases the transconductance of the field effect transistor 402.

A third conductive trace segment 426 is located between the third substrate 408 and the fourth substrate 410. The third conductive trace segment 426 is preferably formed in a process that is used to form the second gate electrode 424 and preferably electrically connects to the second gate electrode 424. A via 428 that is bounded by a peripheral wall 428A passes through the four substrates 404-410 and is aligned with the second conductive trace segment 416 (located between the first 404 and second 406 substrates) and with the third conductive trace segment 426. The via 428 can for example be formed by mechanical or laser drilling or by etching. A conductive material 430 that is disposed within the via 428 electrically contacts the second conductive trace segment 416, and the third conductive trace segment 426. The conductive material 430 can for example comprise a conductive adhesive, or a metal applied by plating. The first and second gate electrodes 412, 424 can be connected via the second and third conductive trace segments 416, 426 and the conductive material 430.

Additional substrates are alternatively provided in any of the foregoing embodiments. Additional substrates are alternatively used to accommodate additional devices, and/or interconnect conductive traces.

Figure 5:
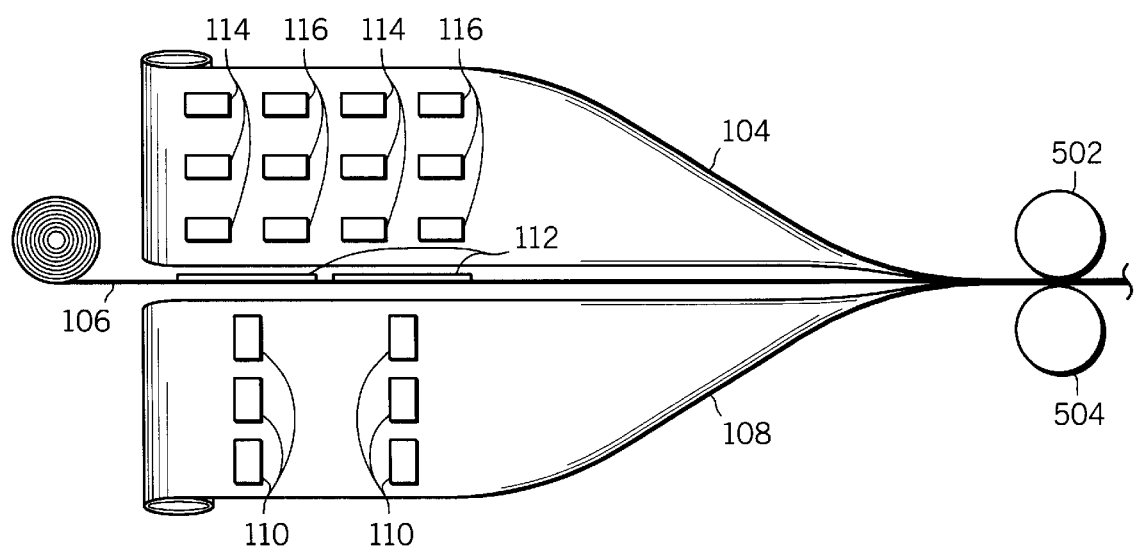
FIG. 5 is a schematic illustration of a lamination process involved in fabricating the integrated circuit shown in FIG. 1 according to the preferred embodiment of the invention.

FIG. 5 is a schematic illustration of a lamination process involved in fabricating the integrated circuit shown in FIG. 1 according to the preferred embodiment of the invention. As shown in FIG. 5 the first substrate 104, the second substrate 106 and the third substrate 108 are provided in the forms of rolls of web. As seen in FIG. 5 the first substrate supports a plurality of source electrodes 114, and drain electrodes 116. (The contact enhancing material 118 is not shown in FIG. 5, although it can be provided on the source and drain electrodes 114, 116.) The second substrate 106 supports a plurality of organic semiconductor channels 112, and the third substrate 108 supports a plurality of gate electrodes 110. As shown in FIG. 5 the three substrates 104, 106, 108 in the form of webs are fed through a small gap between a first roller 502 and a second roller 504 and are thereby laminated together. For certain substrates, it can be desirable to heat the rollers 502, 504 or to heat the substrates immediately prior to laminating the substrates together, in order to obtain improved lamination.

Laminating the substrates 104, 106, 108 thins the device layers, including the organic semiconductor channel 112, and the second substrate 106 which serves as the gate dielectric layer 106, and thereby increases the transconductance of the resulting field effect transistors 102. Using lamination allows different device layers, e.g., channel gate, to be formed separately on separate substrates. Not having to form one device layer over another on the same substrate tends to increase the accuracy with which device structures can be constructed, and reduces the achievable critical dimensions (e.g., dielectric and semiconductor layer thickness) of device structures. As will be described further below a variety of printing process are alternatively used to form device structures. The accuracy and design flexibility achievable with such processes is improved if device structures are formed separately on separate substrates relative to what could be achieved if all device layers were formed on a single substrate.

Alternatively, in lieu the first and second rollers 502, 504, a press type laminator is used. A press type laminator in which the environment of the substrates undergoing lamination can be evacuated can also be used. By using vacuum lamination, trapping of gas between the substrates 104, 106, 108 can be avoided. Press type laminators are especially suitable for sheet fed substrate processing, as opposed to web fed substrate processing. The substrates 104, 106, 108 are alternatively provided in the form of discrete sheets as opposed to a continuous web. If a web is used it will be cut into discrete pieces each of which includes one or more integrated circuits following lamination.

Figure 6:
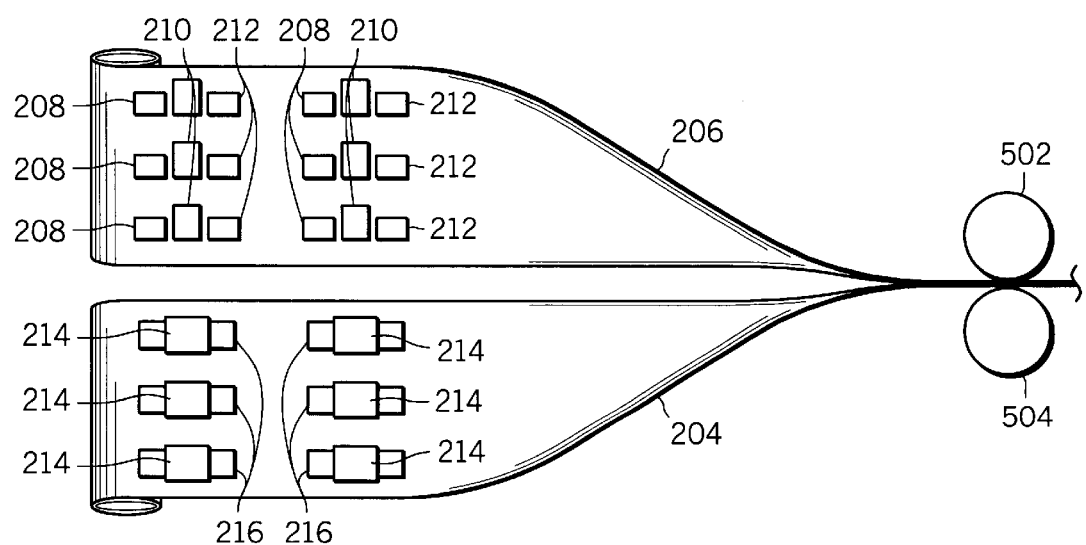
FIG. 6 is a schematic illustration of a lamination process involved in fabricating the integrated circuit shown in FIG. 2 according to the first alternative embodiment of the invention.

FIG. 6 is a schematic illustration of a lamination process involved in fabricating the integrated circuit shown in FIG. 2 according to the first alternative embodiment of the invention. As shown in FIG. 6, the first substrate 204 and the second substrate 206 take the form of webs. A plurality of source electrodes 208, gate electrodes 210, and drain electrodes 212 are formed on the second substrate 206. A plurality of organic semiconductor channels 216 are formed on the first substrate 204. A plurality of dielectric patches 214 is formed on the first substrate 204 overlying the organic semiconductor channels 216. As shown in FIG. 6, the first substrate 204 and the second substrate 206 are fed through a narrow gap between the first 502 and second 504 rollers. As discussed above in connection with FIG. 5 other types of lamination equipment is alternatively employed in lieu of the first and second rollers 502, 504. In passing between the first and second rollers 502, 504 the two substrates 206 204 are compressed, and laminated together. Device layers included the dielectric patches 214, and the organic semiconductor channels 216 are thinned by the lamination process which results in the manufactured field effect transistors 202 having a higher transconductance. Although not shown in FIG. 5 other conductive traces, other types of devices, and other functional or non-functional features are alternatively included in integrated circuits.

Figure 7:
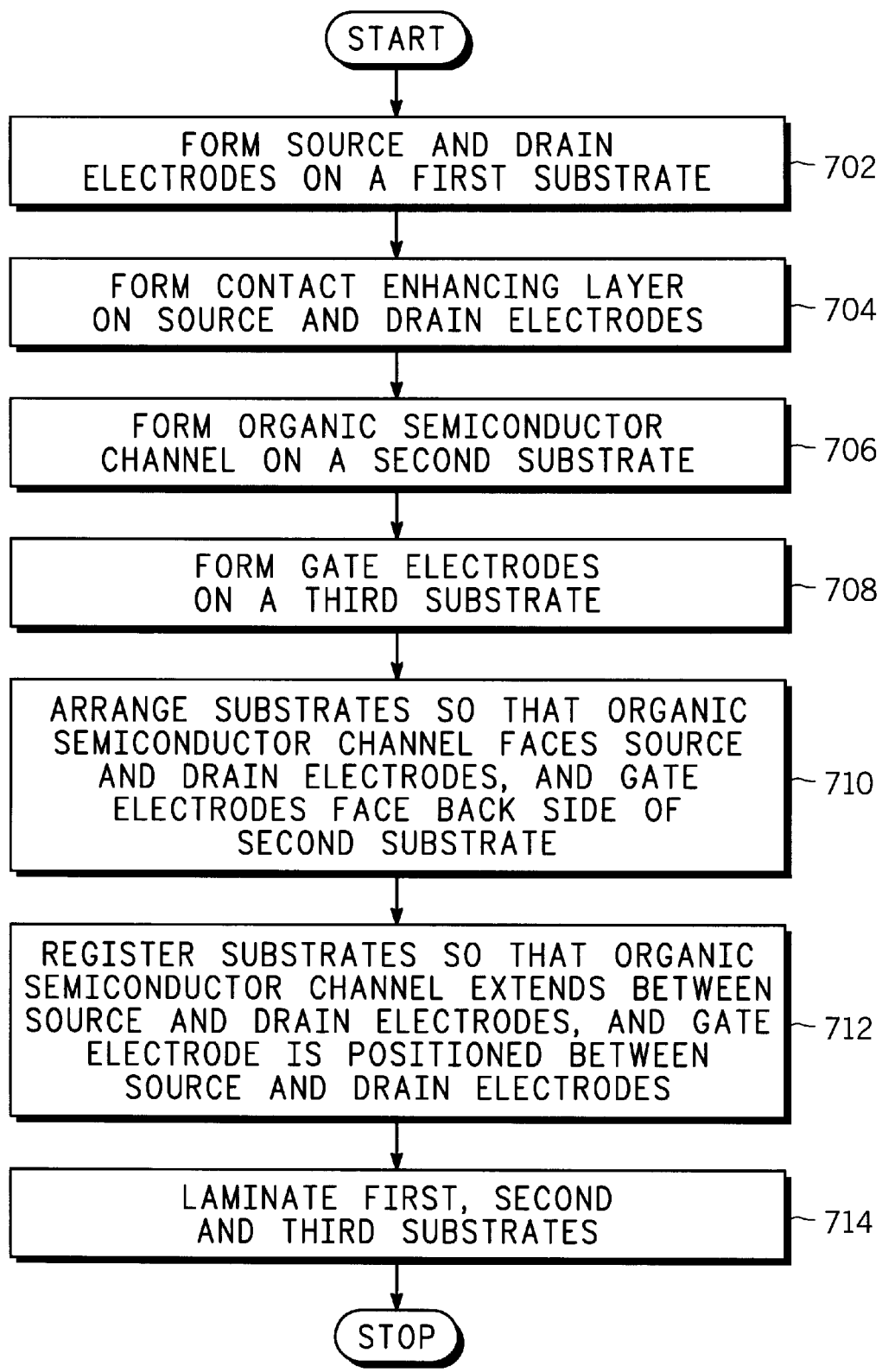
FIG. 7 is a flow chart of a process for fabricating the integrated circuit including the field effect transistor shown in FIG. 1 according to the preferred embodiment of the invention.

FIG. 7 is a flow chart of a process for fabricating the integrated circuit including the field effect transistor shown in FIG. 1 according to the preferred embodiment of the invention. In step 702 the source and drain electrodes 114, 116 are formed on the first substrate 104. A variety of processes can alternatively be used to form the source and drain electrodes 114, 116 of the preferred and other embodiments. The drain and source electrodes 114, 116 can for example comprise patches of metal that are defined by patternwise etching a metal film using a resist. Alternatively, the source and drain electrodes 114, 116 comprise an inorganic nanoparticle metal, conductive polymer such as polyaniline, polyethylene dioxythiophene sulfonate, doped polythiophene, or a non conductive polymer that includes a conductive filler material. The drain and source electrodes 114, 116 and electrodes of other embodiments, can be applied by a variety of methods including jetting, microdispensing, microcontact printing, gravure printing, flexography printing, or offset printing. Alternatively, a blanket layer of material, out of which the source and drain electrodes are to be formed, is deposited on the first substrate, and subsequently patterned. Patterning can, for example, be accomplished by patternwise etching, patternwise photopolymerization, of patternwise exposure to radiation, e.g., ultraviolet, that selectively alters the solubility of the blanket coating, followed by development by immersion in a solvent. Alternatively, prior to the material out of which the electrodes 114, 116 are to formed is applied, the first substrate 104 is selectively exposed, e.g., through a mask to radiation e.g., ultraviolet to selectively change the adhesion e.g., hydrophilic adhesion of the substrate with respect to the material out of which the electrodes 114, 116 are to be formed. Subsequently when the electrode material is applied it will only adhere to certain portions (e.g., those exposed or those not exposed) of the first substrate 104.

A variety of different types of substrate materials can be used for the first, second and third substrates 104, 106, 108 of the preferred embodiment and for substrates of other embodiments. Preferably, the substrate is a material selected form the group consisting of cloth, paper, or a polymeric film such as polyester, polyimide, polypropylene, and polycarbonate. The substrates are preferably flexible.

In step 704 the contact enhancing material 118 is applied to the source and drain electrodes. Alternatively, the contact enhancing material 118 is not used. Metal source and drain electrodes 114, 116, along with a contact enhancing material can be formed by blanket depositing a base metal, and the contact enhancing material, and subsequently patterning the base metal and the contact enhancing material. Alternatively, the base metal can be applied and patterned, and then the contact enhancing material added by electroplating or deposition.

In step 706 the organic semiconductor channels 112 are formed on the second substrate 106. The organic semiconductor channels 112 can for example comprise a material from the polythiophene family, such as poly(3-alkylthiophene), poly(3-hexylthiophene), poly(3-dodecylthiophene), or poly(3-alkylthiophene-2,5-diyl); an oligothiophene such as sexithiophene; an alkyl-substituted anthradithiophene such as 2,8-dihexylanthradithiophene or 2,8-dioctadecylanthradithiophene, an alkylsubstituted napthadithiophene such as 2,8-dihexylnapthadithiophene or 2,8-dioctadecylnapthadithiophene; a fused-ring tetracarboxylic diimide such as naphthalene 1,4,5,8-tetracarboxylic acid diimides or anthracene 2,3,6,7-tetracarboxylic acid diimide; polyaniline; perylene; fullerenes (e.g., $C_{60}$); poly(phenylene-vinylene); poly(thienylene-vinylene); pentacene; or phthalocyanine coordination compounds where the coordinate ion is for example platinum (Pt), copper (Cu), zinc (Zn), nickel (Ni), tin (Sn), iron (Fe), or hydrogen ($H_2$).

The organic semiconductor channels 112 can be formed by a variety of methods including jetting, microdispensing, microcontact printing, gravure printing, flexography printing, or offset printing. Alternatively, as described above in connection with the source and drain electrodes 114, 116, a blanket layer is applied to the second substrate 106, and then subsequently patterned to form the organic semiconductor channels 112. Organic semiconductors have the advantage that, in contrast to traditional inorganic semiconductors (e.g., Si, GaAs), devices made of organic semiconductor, e.g., channel 112, can be formed by using the aforementioned printing, blanket coating, and other patterning techniques. Such techniques are less complex and costly than traditional semiconductor fabrication techniques.

In step 708, the gate electrodes 110 are formed on the third substrate 108. The gate electrodes 110 can be metal in which case they can for example be formed by blanket coating (e.g., by sputtering) the third substrate 108 with metal out of which the gate electrodes 110 are to be formed, and subsequently patterning the metal. However, preferably the gate electrodes 110 are formed of a conductive polymer such as polyaniline, polyethylene, dioxythiophene sulfonate, or doped polythiophene. Conductive polymer gate electrodes can for example be deposited using the same techniques mentioned above in connection with the organic semiconductor channels 112 and the source 114 and drain 116 electrodes.

In step 710 the three substrates 104, 106, 108 of the first embodiment are arranged so that a side of the second substrate 106 on which the organic semiconductor channel 112 is formed faces a side of the first substrate 104 on which the source and drain electrodes are formed, and a side of the third substrate 108 on which the gate electrodes 110 are formed faces the back (side opposite of organic semiconductor channel 112) of the second substrate 106.

In step 712, the three substrates 104, 106, 108 are brought into registration so that the semiconductor channels 112 extend between the source electrodes 114 and the drain electrodes 116, and the gate electrodes 110 are positioned between the source 114 and drain electrodes 116. The electrodes 110, 114 overlap the organic semiconductor channel 112.

In step 714 the three substrates 104, 106, 108 are laminated together to form the integrated circuit 100 including one or more of the field effect transistors 102. Alternatively, the three substrates 104, 106, 108 can be laminated between additional films (not shown) that provide protection against environmental degradation such as for example degradation induced by atmospheric oxygen, moisture or light. The additional barrier films preferably substantially attenuate optical radiation that is harmful to device structures (e.g., organic semiconductor channels 112). Barrier films can for example comprise a polymeric film that is coated with a barrier material such as silica or a metal (e.g., copper or aluminum). Aluminum coated mylar can be used as the additional films that protect against environmental degradation. Alternatively, the aforementioned barrier films are designed to provide limited protection against environmental degradation, in order to limit the lifetime of the integrated circuit 102 to a predetermined average time (e.g., 90 days).

Figure 8:
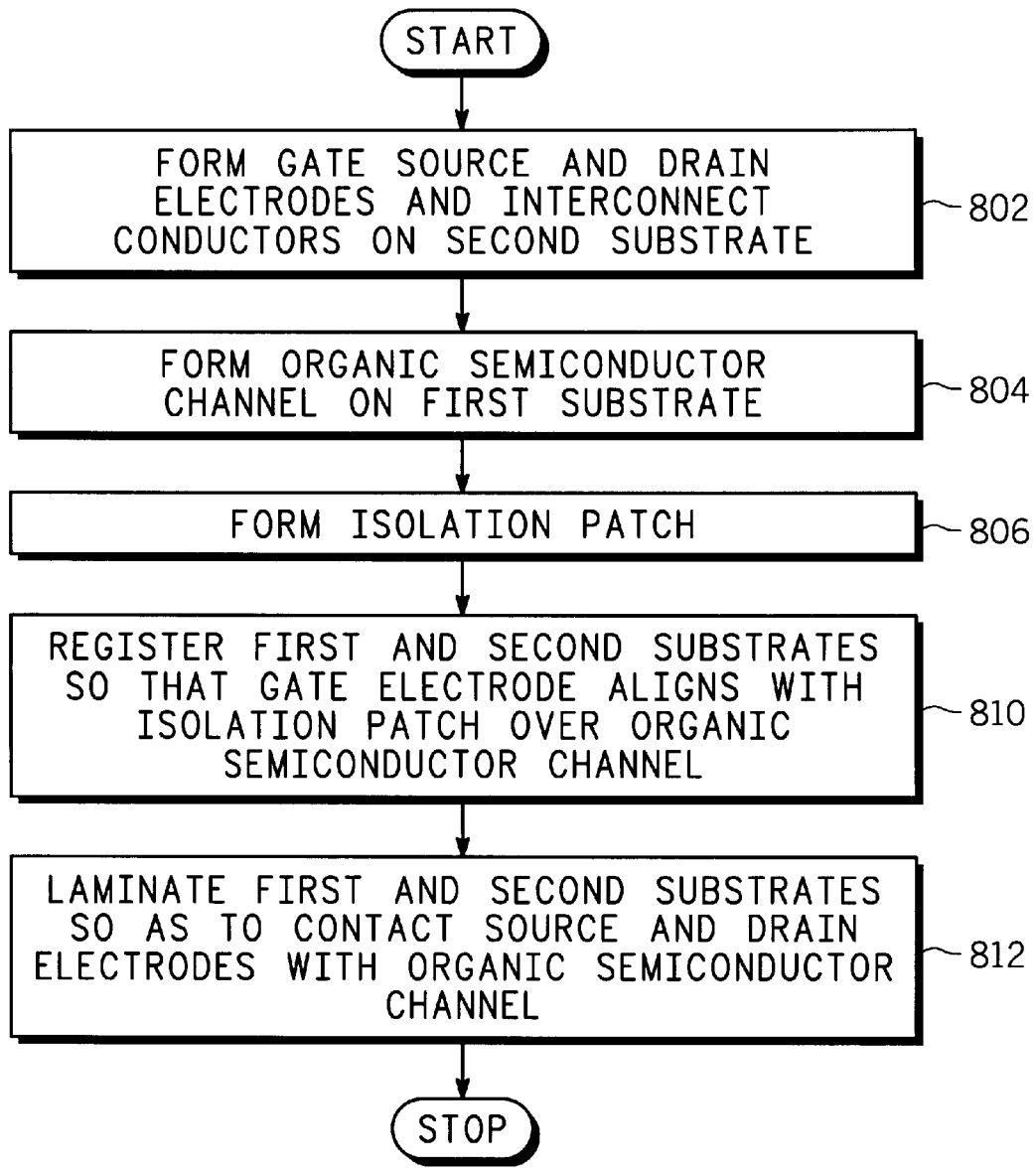
FIG. 8 is a flow chart of the process for fabricating the integrated circuit including the field effect transistor shown in FIG. 2 according to the first alternative embodiment of the invention.

FIG. 8 is a flow chart of the process for fabricating the integrated circuit 200 including the field effect transistor 202 shown in FIG. 2 according to the first alternative embodiment of the invention. In step 802 the source 208, gate 210, and drain 212 electrodes are formed on the second substrate 206. In step 804 the organic semiconductor channel 216 is formed on the first substrate 204. In step 806 the dielectric patch 214 is formed. The dielectric patch 214 is preferably formed over the organic semiconductor channel 216. Alternatively, the dielectric patch 214 is formed over the gate electrode 210. In step 810, the first and second substrates 204, 206 are brought into registration so that the gate electrode 210 aligns with the dielectric patch 214 over the organic semiconductor channel 216. In step 812, the first and second substrates are laminated together so as to contact the source and drain electrodes 208, 212 with the organic semiconductor channel 216.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A field effect transistor including:
   a first substrate;
   a second substrate laminated to the first substrate;
   a gate electrode;
   a source electrode located between the first and second substrates;
   a drain electrode located between the first and second substrates; and
   an organic semiconductor located between the first and second substrates proximate the gate electrode, and in electrical contact with the source electrode and the drain electrode;
   wherein, the first substrate is selected from the group consisting of polymeric film, paper and cloth; and
   the second substrate is selected from the group consisting of polymeric film, paper and cloth.

2. The field effect transistor according to claim 1 wherein:
   the gate electrode is located between the first substrate and the second substrate.

3. The field effect transistor according to claim 2 further comprising:
   a dielectric material interposed between the gate electrode and the organic semiconductor.

4. The field effect transistor according to claim 1 wherein:
the first substrate comprises:
a first side that faces the second substrate; and
a second side; and
the gate electrode is on the second side of the first substrate.

5. The field effect transistor according to claim 1 further comprising:
a third substrate, wherein the gate electrode is proximate the third substrate.

6. The field effect transistor according to claim 5 wherein:
the first substrate, the second substrate and the third substrate are laminated together.

7. The field effect transistor according to claim 1 further comprising:
a contact enhancing material disposed between the source electrode and the organic semiconductor and between the drain electrode and the organic semiconductor.

8. A field effect transistor including:
a first substrate;
a second substrate laminated to the first substrate;
a gate electrode;
a source electrode located between the first and second substrates;
a drain electrode located between the first and second substrates; and an organic semiconductor located between the first and second substrates proximate the gate electrode, and in electrical contact with the source electrode and the drain electrode;
a contact enhancing material disposed between the source electrode and the organic semiconductor and between the drain electrode and the organic semiconductor;
wherein the contact enhancing material is selected from the group consisting of; chromium, non-ferrous alloys of chromium, zinc, alloys of zinc, titanium, alloys of titanium, tin, and tin alloys.

9. A field effect transistor including:
a first substrate;
a second substrate laminated to the first substrate;
a gate electrode;
a source electrode located between the first and second substrates;
a drain electrode located between the first and second substrates; and an organic semiconductor located between the first and second substrates proximate the gate electrode, and in electrical contact with the source electrode and the drain electrode
a contact enhancing material disposed between the source electrode and the organic semiconductor and between the drain electrode and the organic semiconductor;
wherein;
the organic semiconductor comprises a polythiophene family compound; and
the contact enhancing layer comprises octadecyl-trichlorosilane.

10. A method of manufacturing an integrated circuit that includes an electrode device, the method comprising the steps of:
applying an organic semiconductor to a first substrate; and
thereafter, laminating a second substrate to the first substrate over the organic semiconductor prior to performing the step of laminating, forming a first electrode on the second substrate on a side of the second substrate char is to face the first substrate, in a position that is to be in at least partially overlapping relation with the organic semiconductor;
whereby, upon performing the step of lamination, an electrical contact is established between the organic semiconductor and the first electrode.

11. The method according to claim 10 further comprising the step of:
prior to performing the step of laminating, forming a dielectric layer in at least partially overlapping relation with the organic semiconductor and the first electrode.

12. The method according to claim 10 further comprising the step of:
prior to performing the step of laminating, forming a second electrode on the second substrate on the side of the second substrate that is to face the first substrate, in a position that is to be in at least partially overlapping relation with the organic semiconductor.

13. The method according to claim 10 further comprising the step of: prior to performing the step of laminating, forming a second electrode on a third substrate;
wherein the step of laminating the first substrate to the second substrate comprises the step of:
laminating the first, second and third substrates together.

14. The method according to claim 10 further comprising the step of:
prior to performing the step of laminating, forming a contact enhancing layer in at least partially overlapping relation with the organic semiconductor and the first electrode.

15. The method according to claim 14 wherein the step of forming the contact enhancing layer comprises the sub-step of:
forming the contact enhancing layer on the first electrode.

* * * * *